United States Patent
Hsieh et al.

(10) Patent No.: US 11,705,164 B2
(45) Date of Patent: *Jul. 18, 2023

(54) BIAS CURRENT GENERATOR CIRCUITRY

(71) Applicant: Micron Technology, Inc., Boise, ID (US)

(72) Inventors: Ming-ta Hsieh, Woodbury, MN (US); Taylor Loftsgaarden, Eden Prairie, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,535

(22) Filed: Jun. 6, 2022

(65) Prior Publication Data

US 2022/0301601 A1 Sep. 22, 2022

Related U.S. Application Data

(63) Continuation of application No. 16/838,205, filed on Apr. 2, 2020, now Pat. No. 11,355,164.

(51) Int. Cl.
*G05F 3/24* (2006.01)
*G11C 5/14* (2006.01)
*G11C 16/30* (2006.01)

(52) U.S. Cl.
CPC .......... *G11C 5/147* (2013.01); *G05F 3/24* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 4,270,081 | A | 5/1981 | Hareyama |
| 4,325,018 | A | 4/1982 | Schade, Jr. |
| 5,432,432 | A | 7/1995 | Kimura |
| 5,512,816 | A | 4/1996 | Lambert |
| 5,783,936 | A | 7/1998 | Girard |
| 5,990,727 | A | 11/1999 | Kimura |
| 6,051,966 | A | 4/2000 | Pontarollo |
| 6,956,397 | B2 | 10/2005 | Lim |
| 9,106,128 | B2 | 8/2015 | Lee |
| 9,123,412 | B2 | 9/2015 | Takahashi |
| 9,830,986 | B2 | 11/2017 | Kim |
| 9,870,807 | B2 | 1/2018 | Ono |
| 10,187,052 | B2 | 1/2019 | Draxelmayr |
| 10,325,635 | B2 | 6/2019 | Grunzke |

(Continued)

OTHER PUBLICATIONS

International Search Report and Written Opinion from related international application No. PCT/US2021/023864, dated Jul. 13, 2021, 11 pages.

*Primary Examiner* — Thomas J. Hiltunen
(74) *Attorney, Agent, or Firm* — Brooks, Cameron & Huebsch, PLLC

(57) ABSTRACT

A supply voltage sensitivity of an output current of a bias current generator circuit is reduced. The bias current generator includes a plurality of transistors and a plurality of resistors coupled to the plurality of transistors. The supply voltage sensitivity of the output current of the bias current generator circuit is reduced by applying a second bias current generated by the bias current generator circuit to a first bias current generated by the bias current generator circuit.

17 Claims, 4 Drawing Sheets

(56) References Cited

U.S. PATENT DOCUMENTS

| | | | |
|---|---|---|---|
| 10,606,300 B2 | 3/2020 | Chu | |
| 10,917,008 B2 | 2/2021 | Hsiao | |
| 11,355,164 B2 * | 6/2022 | Hsieh | ................ G05F 3/24 |
| 2007/0290660 A1 * | 12/2007 | Yamazaki | ............ G05F 1/613 |
| | | | 323/315 |
| 2010/0074034 A1 | 3/2010 | Cazzaniga | |
| 2011/0043185 A1 | 2/2011 | Kim | |
| 2012/0218026 A1 | 8/2012 | Nadimpalli | |
| 2018/0047442 A1 | 2/2018 | Hsu | |
| 2018/0061499 A1 | 3/2018 | Disegni | |

* cited by examiner

309 ─╮
      ↘

┌─────────────────────────────────────────────────────────────┐
│ REDUCING A SUPPLY VOLTAGE SENSITIVITY OF AN OUTPUT CURRENT  │
│ OF BIAS CURRENT GENERATOR CIRCUITRY BY GENERATING A FIRST   │
│ BIAS CURRENT USING THE BIAS CURRENT GENERATOR CIRCUITRY,    │
│ GENERATING A SECOND BIAS CURRENT USING THE BIAS CURRENT     │─312
│ GENERATOR CIRCUITRY, AND SUBTRACTING THE SECOND BIAS CURRENT│
│ FROM THE FIRST BIAS CURRENT TO REDUCE                       │
│ THE SUPPLY INDUCED COMMON-MODE BIAS CURRENT                 │
└─────────────────────────────────────────────────────────────┘
                              │
┌─────────────────────────────────────────────────────────────┐
│     PROVIDING THE OUTPUT CURRENT OF THE BIAS CURRENT        │─314
│     GENERATOR CIRCUITRY TO ADDITIONAL CIRCUITRY             │
└─────────────────────────────────────────────────────────────┘

*FIG. 3*

BIAS CURRENT GENERATOR CIRCUITRY

PRIORITY INFORMATION

This application is a Continuation of U.S. application Ser. No. 16/838,205, filed on Apr. 2, 2020, the contents of which are incorporated herein by reference.

TECHNICAL FIELD

Embodiments of the disclosure relate generally to a memory sub-system, and more specifically, relate to bias current generator circuitry.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a flow diagram of an example method for reducing a supply voltage sensitivity of an output current of bias current generator circuitry in accordance with some embodiments of the present disclosure.

DETAILED DESCRIPTION

Figure 1:
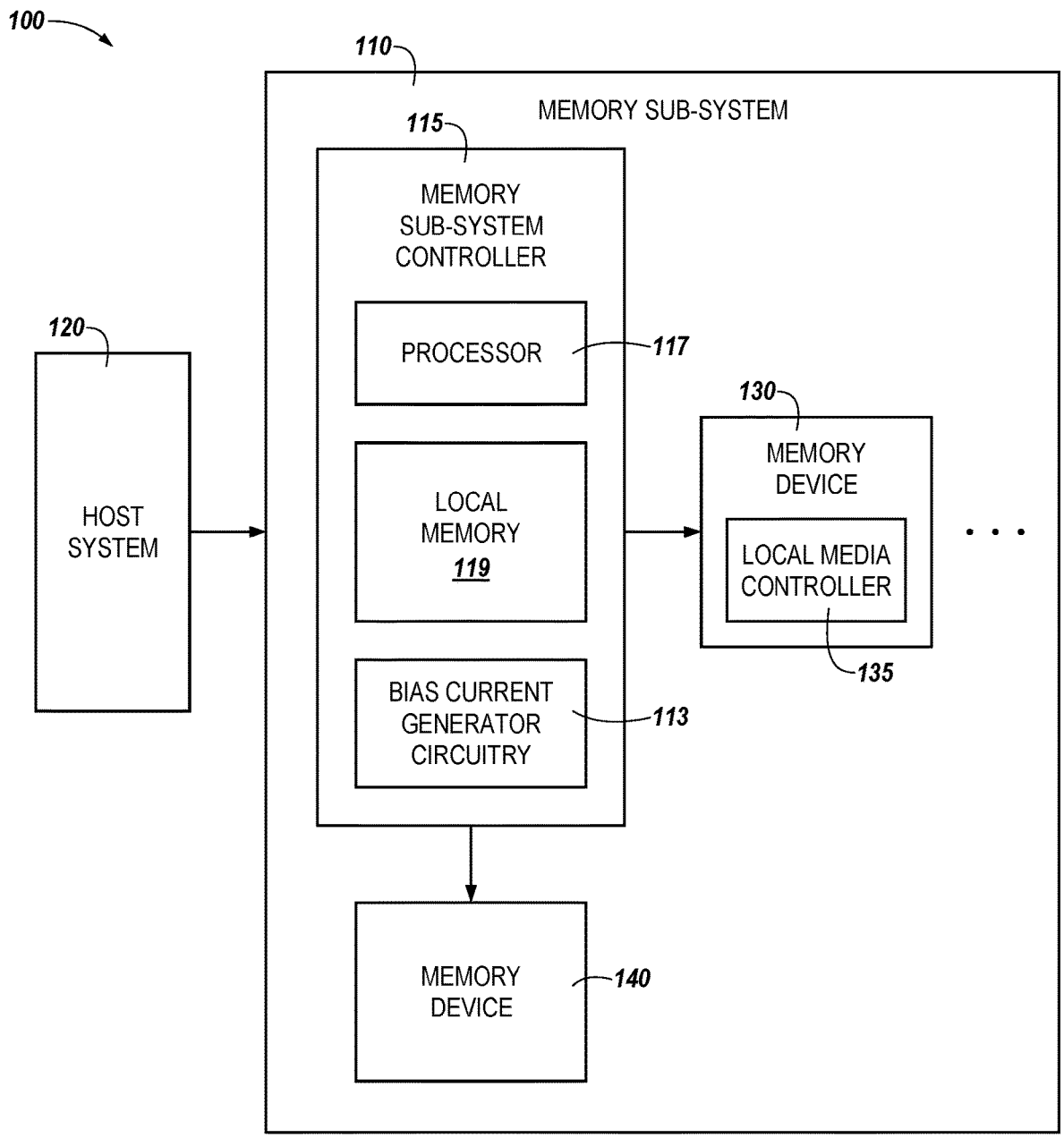
FIG. 1 illustrates an example computing system that includes a memory sub-system in accordance with some embodiments of the present disclosure.

Aspects of the present disclosure are directed to bias current generator circuitry in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

When bias current generator circuitry generates an output current, that output current may have a supply voltage sensitivity. For instance, a variation in the supply voltage may cause the magnitude of the output current to vary. The supply current, and therefore the output current, may be sensitive to a variety of factors including, but not limited to, parasitic capacitance and noise. As used herein, the term "parasitic capacitance" can refer to an electrical charge that is stored on an electrical component as a result of an electric field that forms between the electrical components when they are in close proximity to each other. As used herein, the term "noise" can refer to an error or undesired random disturbance of an information signal.

The variance in the output current generated by the bias current generator circuitry may have a detrimental effect on a circuit that receives the output current because circuits are configured to accept certain magnitudes of input current. The detrimental effects can include, but are not limited to, supplying too much current to the circuit or supplying an insufficient amount current to the circuit. Supplying too much current to the circuit can result in overheating electrical components in the circuit and shortening the lifespans of those components. Supplying an insufficient amount of current to the circuit can result in a circuit not performing its intended function because it is not receiving enough current to power it electrical components.

In conventional memory sub-systems, a resistor may be used in the bias current generator circuitry to reduce the supply voltage sensitivity. However, this may lead to the output current changing as the input voltage changes. This means that any variation in the supply voltage can lead to variation in the output current and cause the detrimental effects described above.

One alternative technique of reducing supply voltage sensitivity of bias current generator circuitry is to couple (e.g., add) a voltage regulator to the circuit to the bias current generator circuitry within the memory sub-system. As used herein, a "voltage regulator" can refer to an electrical component designed to regulate a voltage level by generating an output voltage that remains constant for any changes in an input voltage or load conditions. Adding a voltage regulator to the memory sub-system, however, dedicates additional space to the bias current generator in the memory sub-system, which reduces the amount of space that can be dedicated to improving other functions of the memory sub-system, such as adding more processors to improve the speed of the memory sub-system.

Another alternative technique to reducing a supply voltage sensitivity of bias current generator circuitry is to add a compensation circuit with a negative supply voltage sensitivity to the bias current generator circuitry. The compensation circuit can reduce the total supply voltage sensitivity of the output current generated by the bias current generator circuitry. Adding the compensation circuit to the memory sub-system, however, dedicates additional space in the memory sub-system to the bias current generator circuitry, which reduces the amount of space available to improve other functions of the memory sub-system.

Aspects of the present disclosure address the above and other deficiencies by forming bias current generator circuitry that can generate a second (e.g., additional) bias current to apply to (e.g., subtract from) a first (e.g., primary) bias current generated by the bias current generator circuitry. Generating the second bias current to apply to the first bias current to reduce the supply induced common-mode bias current can provide a variety of benefits to the memory sub-system, such as reducing the supply voltage sensitivity of the output current generated by the bias current generator circuitry and minimizing the amount of space occupied by the bias current generator circuitry within the memory sub-system.

One benefit of generating the second bias current to apply to the first bias current is that applying the second bias current reduces the supply voltage sensitivity of the first bias current, which can then be used as the output current of the bias current generator circuitry within a memory sub-system. As used herein, a "bias current" can refer to a direct current (DC) meant to establish predetermined voltages or currents at various points in a circuit to establish proper operating conditions in electronic components. Another benefit of generating a second bias current to apply to the first bias current is that the circuitry used to generate the second bias current occupies less space within a memory sub-system than alternative techniques to reduce supply voltage sensitivity.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, the term "coupled to" or "coupled with" can refer to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via an interface (e.g., a physical host interface). Examples of an interface can include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., a DIMM socket interface that supports Double Data Rate (DDR)), Open NAND Flash Interface (ONFI), Double Data Rate (DDR), Low Power Double Data Rate (LPDDR), Universal Serial Bus (USB), or any other interface. The interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The interface can provide a way for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type memory (e.g., 2D NAND, 3D NAND) are described, the memory device 130 can be based on any other type of non-volatile memory or storage device, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g. processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface (not pictured) circuitry to communicate with the host system 120 via a physical host interface (not pictured). The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes bias current generator circuitry 113. In some embodiments, the bias current generator circuitry 113 is located on a memory sub-system controller 115. In some embodiments, the bias current generator circuitry 113 is not part of the memory sub-system controller 115. The bias current generator circuitry 113 can be used to reduce the supply voltage sensitivity of an output current generated by the bias current generator circuitry. The bias current generator circuitry 113 can include a plurality of resistors and a plurality of transistors coupled to the plurality of transistors, as will be further described herein (e.g., in connection with FIG. 2). In some embodiments, the memory sub-system 110 includes bias current generator circuitry 113 that can reduce the supply voltage sensitivity of the output current of the bias current generator circuitry 113 by generating a second bias current to apply to a first bias current that was generated by the bias current output circuitry 113. In some embodiments, the memory sub-system controller 115 includes at least a portion of the bias current generator circuitry 113. For example, the memory sub-system controller 115 can include a processor 117 (processing device) configured to execute instructions stored in local memory 119 for performing the operations described herein.

Bias current generator circuitry 113 can reduce the supply voltage sensitivity of the output current generated by the bias current generator circuitry 113 by applying a second (e.g., additional) bias current generated by the bias current generator circuitry to a first (e.g., primary) bias current generated by the bias current generator circuitry, which can then be used as the output voltage of the bias current generator circuitry. That is, the output current can be generated by applying the second bias current to the first bias current. Both the first bias current and the second bias current can be DC. In some embodiments, the magnitude of the first bias current is greater than the magnitude of the second bias current.

Figure 2:
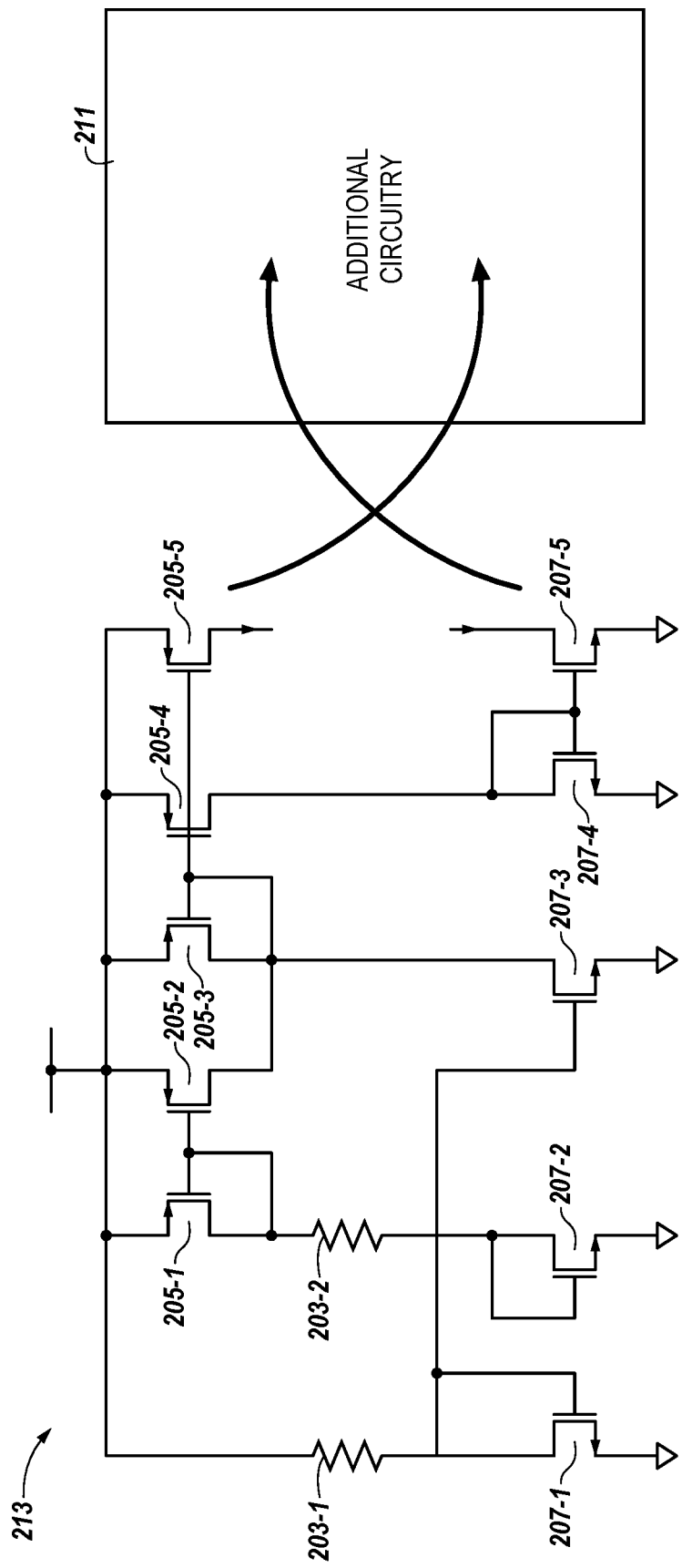
FIG. 2 illustrates an example of bias current generator circuitry in accordance with some embodiments of the present disclosure.

For an application that allows for supply accuracy of ten percent greater or less than nominal, when the second bias current is not applied to the first bias current, the dependence of the output current on the supply voltage may result in the output current being approximately ten percent greater than or less than the intended magnitude of the output current. However, applying the second bias current to the first bias current, as described herein, can reduce the dependence of the output current on the supply voltage. In some embodiments, applying the second bias current to the first bias current can reduce the dependence of the output current on the supply voltage to approximately two percent greater than or less than the intended magnitude of the output current. In some embodiments, the bias current generator circuitry can be configured to reduce the dependence of the output current on the supply voltage to less than two percent greater than or less than the intended output current FIG. 2 illustrates an example of bias current generator circuitry 213 in accordance with some embodiments of the present disclosure. Bias current generator circuitry 213 can be, for instance, bias current generator circuitry 113 previously described in connection with FIG. 1. The bias current generator circuitry 213 can include parallel resistors 203-1 and 203-2 (individually or collectively referred to as resistors 203), transistors 205-1, 205-2, 205-3, 205-4, and 205-5 (individually or collectively referred to as transistors 205) that can be coupled to source and transistors 207-1, 207-2, 207-3, 207-4, and 207-5 (individually or collectively referred to as transistors 207) that can be coupled to ground.

In the example shown in FIG. 2, the bias current generator circuitry 213 can include multiple conductive pathways that include resistors 203. For example, the bias current generator circuitry 213 can include a first conductive pathway including resistor 203-1 and a second conductive pathway including resistor 203-2. The first bias current can flow through the resistor 203-1 on the first conductive pathway and the second bias current can flow through the resistor 203-2 on the second conductive pathway. That is, resistor 203-1 can be used to generate the first bias current, and resistor 203-2 can be used to generate the second bias current. The resistor 203-1 can be coupled to a source/drain region of the transistor 207-1 and the resistor 203-2 can be coupled to the source/drain region of the transistor 207-2.

The second conductive pathway can also include a transistor 205-1. A source/drain region of the transistor 205-1 can be coupled to the resistor 203-2. The gate of the transistor 205-1 can be coupled to the gate of transistor 205-2. The second conductive pathway (e.g., resistor 203-2) can also be coupled to the gates of the transistors 205-1 and 205-2.

Including the resistor 203-2 and transistors 205-1, 205-2, and 207-2 can provide a variety of benefits to bias current generator circuitry 213. For example, as stated above, the resistor 203-2 can be used to generate the second bias current. The second bias current can be applied to the first bias current to reduce the variance of the magnitude of the first bias current and the supply voltage sensitivity of the output current. In some embodiments, applying the second bias current to the first bias current can generate the output current, as previously described herein.

The first current generated through resistor 203-1 is, to first order, proportional to the supply minus one diode drop. The second current generated through resistor 203-2 is, to first order, proportional to the supply minus two diode drops. This makes the second current a stronger function of the supply. Subtracting the second current from the first current can, to first order, remove the supply sensitivity from the output current. The resulting supply sensitivity of the output current is due to the second order effects of the diode drops and resistivity of resistors 203.

The output current generated by the bias current generator circuitry 213 can be provided to additional circuitry 211. For example, transistors 205-5 and 207-5 can be coupled to the additional circuitry 211 to provide the output current to additional circuitry 211. Additional circuitry 211 may be located on memory device 130 previously described in connection with FIG. 1, for example. In some embodiments, the additional circuitry 211 can be multiple separate circuits. Therefore, the output current generated by the bias current generator circuitry 213 can be provided to multiple separate circuits.

In some embodiments, the additional circuitry 211 can be comparator circuitry. As used herein, the term "comparator circuitry" can refer to circuitry to compare two voltages or currents and outputs a digital signal indicating which is larger. Comparator circuitry can include multiple resistors, multiple transistors, and multiple sense amplifiers. In some embodiments, the transistors 205-5 and 205-7 can be coupled to the sense amplifiers of the comparator circuitry, and the output current can be provided to the inputs of the sense amplifiers. In some embodiments, transistor 205-5 can couple a sense amplifier to source and transistor 207-5 can couple a sense amplifier to ground. In some embodiments, the transistor 205-5 can be coupled to a different circuit than the transistor 207-5.

Decreasing the supply voltage sensitivity of the output current can benefit the additional circuitry 211 to which the bias current generator circuitry 213 provides the output current. As stated above, the additional circuitry 211 can be comparator circuitry. Comparator circuitry can compare two input voltages or currents and output either a 1 or a 0 to indicate which of the two currents or voltages is larger. Variation in the input current of the comparator circuitry can cause incorrect reads in the comparator circuitry. For example, if the input current provided by the bias current generator circuitry 213 is intended to be less than an input current supplied by another source, a variation in the input current supplied by the bias current generator circuitry 213 can cause that input current to be greater than the input current from another source. Alternatively, if the input current supplied by the bias current generator circuitry 213 is intended to be greater than the input current supplied by another source, a variation in the input current supplied by the bias current generator circuitry 213 can cause that input current to be less than the input current from another source. This can cause the comparator circuitry to provide an unintended output. That unintended output can affect other components in a memory sub-system and lead to detrimental effects, such as decreased performance, for the memory sub-system. The input current of the comparator can be the output current of the bias current generator circuitry 213. Applying the second bias current to the first bias current can decrease the supply voltage sensitivity of the bias current generator circuitry's output current. Decreasing the supply voltage sensitivity of the output current can decrease the variation of the output current. Decreasing the variation of the bias current generator's output current can decrease detrimental effects, such as the detrimental effects described above, to the memory sub-system.

Reducing the dependence of the output current on supply improves the power versus performance tradeoff for the comparator circuitry. The current magnitude is sized for minimum acceptable performance for a given application. A large range in current then results in poor worst-case power consumption which also tends to coincide with corners that don't require the performance associated with higher current (e.g., higher supply and fast process). Removing supply dependency allows the circuit to improve performance for a given worst-case power or improve worst-case power for a given desired worst-case performance.

FIG. 3 is a flow diagram of an example method 309 for reducing a supply voltage sensitivity of an output current of bias current generator circuitry in accordance with some embodiments of the present disclosure. The method 309 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 309 is performed by the bias current generator circuitry 113 of FIG. 1 and/or the bias current generator circuitry 213 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 312, the method 309 includes reducing a supply voltage sensitivity of an output current of the bias current generator circuitry by generating a first bias current using the bias current generator circuitry, generating a second bias current using the bias current generator circuitry, and subtracting the second bias current from the first bias current to reduce the supply induced common-mode bias current. The first bias current can be generated using a first resistor (e.g. resistor 203-1 of FIG. 2) and the second bias current can be generated using the second resistor (e.g. resistor 203-2 of FIG. 2). The first and second resistors can be on separate conductive paths in the bias current generator circuitry. The first resistor can be coupled to a source/drain region of a transistor (e.g., transistor 207-1 of FIG. 2) and a gate of a transistor (e.g., transistor 207-3 of FIG. 2). The gates of two transistors (e.g., transistors 205-1 and 205-2 of FIG. 2) can be coupled to each other and the second resistor can be coupled to those gates. The second resistor can also be coupled to a source/drain region of a transistor (e.g., transistor 205-1 of FIG. 2) as well as a source/drain region and a gate of a transistor (e.g., transistor 207-2 of FIG. 2).

At block 314, the method 309 includes providing the output current of the bias current generator circuitry to additional circuitry (e.g., additional circuitry 211 of FIG. 2). In some embodiments, the additional circuitry can be comparison circuitry including multiple sense amplifiers. Transistors in the bias current generator circuit can be coupled to the comparison circuitry to provide the input current to the comparison circuitry. In some embodiments, a first transistor (e.g., transistor 205-5 of FIG. 2) can be coupled to source and a second transistor (e.g., transistor 207-5 of FIG. 2) can be coupled to ground. In some embodiments, the first transistor can couple a sense amplifier of the comparison circuitry to source and the second transistor can couple a sense amplifier of the comparison circuitry to ground.

As stated above, reducing the supply voltage sensitivity of the output current of the bias current generator circuitry can benefit the additional circuitry coupled to the bias current generator circuitry. Variations in the output current of the bias current generator circuitry can cause detrimental effects to the additional circuitry to which the bias current generator circuitry is coupled. These detrimental effects can include, for example, a degradation in the supply induced jitter and duty cycle distortion added to the signal by the comparator circuitry or worse-case power consumption to meet the electrical performance requirements. The output of the bias current generator circuitry can be the input for the comparison circuitry to which the bias current generator circuitry is coupled, therefore, any variation in the output current of the bias current generator circuitry is variation in the input current of the comparison circuitry. Variation in the input current supplied by the bias current generator circuitry can cause that input current to unintentionally be higher or lower than an input current from another source. This can lead to the comparison circuitry erroneously outputting a 1 or a 0 because the variance in the input circuitry affected the relative magnitudes of the input currents.

Figure 4:
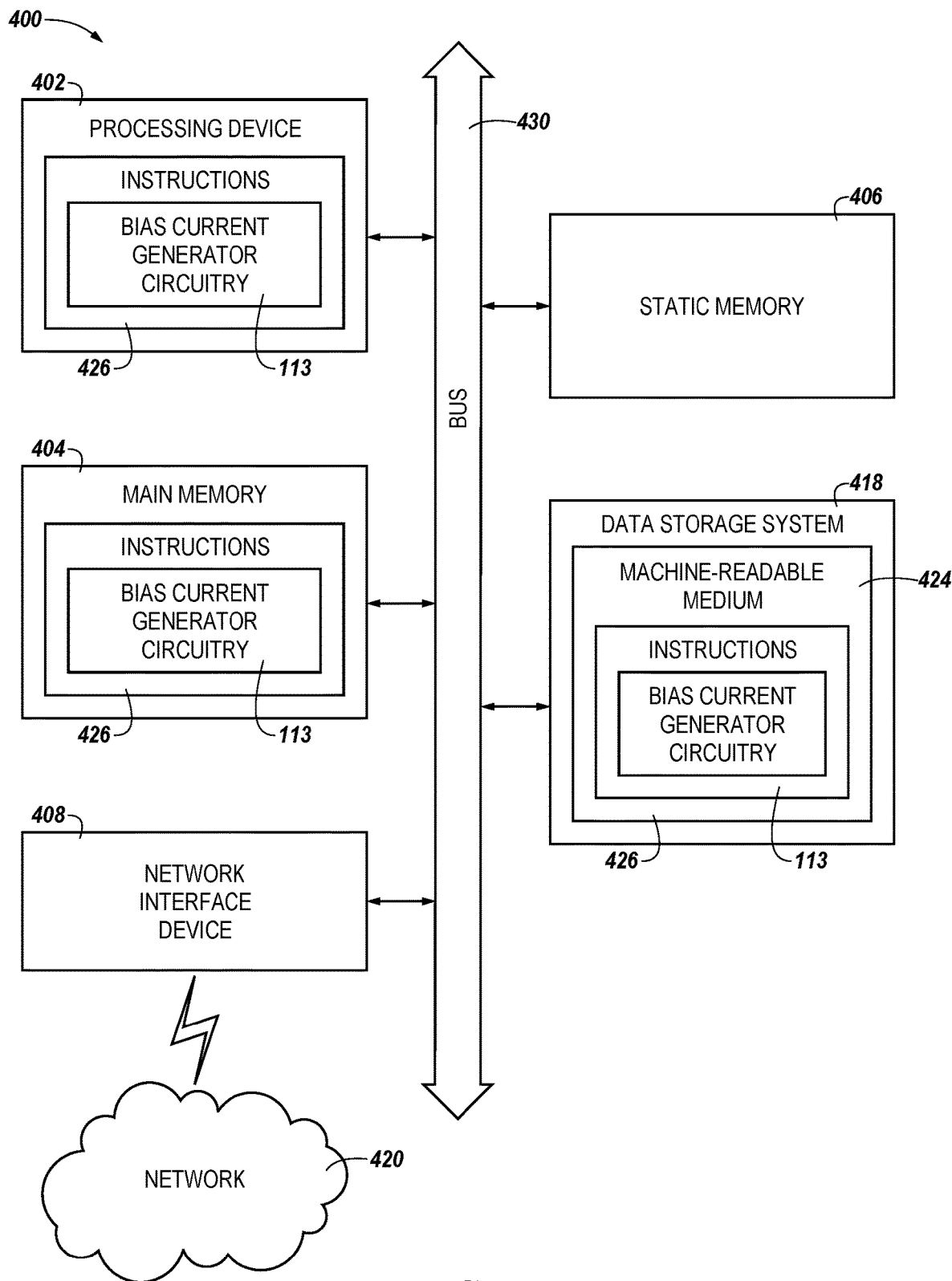
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the bias current generator circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

The processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to bias current generator circuitry (e.g., the bias current generator circuitry 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

The present disclosure includes devices, methods, and systems supporting bias current generator circuitry. A number of embodiments include configurations of bias current generator circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a memory component; and
a processing device, operatively coupled to the memory component, to reduce a supply voltage sensitivity of an output current of a bias current generator circuit provided to the memory component, wherein the bias current generator circuit includes:
a plurality of transistors; and
a plurality of resistors coupled to the plurality of transistors, wherein:
a first one of the plurality of resistors is directly coupled to a source/drain region of a first one of the plurality of transistors and a source/drain region of a second one of the plurality of transistors;
a second one of the plurality of resistors is directly coupled to a source/drain region of a third one of the plurality of transistors and gates of both the second one of the plurality of transistors and a fourth one of the plurality of transistors; and
the first and third one of the plurality of transistors are directly coupled to ground.

2. The system of claim 1, wherein the memory component is a non-volatile memory device.

3. The system of claim 1, wherein the memory component is a volatile memory device.

4. The system of claim 1, wherein the system includes additional circuitry to receive the output current of the bias current generator circuit.

5. The system of claim 4, wherein the additional circuitry is located on the memory component.

6. The system of claim 4, wherein the additional circuitry includes multiple, separate circuits.

7. The system of claim 4, wherein the additional circuitry includes a plurality of resistors.

8. The system of claim 4, wherein the additional circuitry includes a plurality of transistors.

9. The system of claim 4, wherein the additional circuitry includes a plurality of sense amplifiers.

10. The system of claim 1, wherein a magnitude of the output current of the bias current generator circuit is up to two percent (2%) greater than an intended magnitude of the output current of the bias current generator circuit.

11. The system of claim 1, wherein a magnitude of the output current of the bias current generator circuit is up to two percent (2%) less than an intended magnitude of the output current of the bias current generator circuit.

12. A system, comprising:
a memory component; and
bias current generator circuitry, including:
a plurality of transistors; and
a plurality of resistors coupled to the transistors, wherein:
a first one of the plurality of resistors is directly coupled to a source/drain region of a first one of the plurality of transistors and a source/drain region of a second one of the plurality of transistors;
a second one of the plurality of resistors is directly coupled to a source/drain region of a third one of the plurality of transistors and gates of both the second one of the plurality transistors and a fourth one of the plurality of transistors; and
the first and third one of the plurality of transistors are directly coupled to ground.

13. The system of claim 12, wherein the bias current generator circuitry is to generate a first bias current using the first one of the plurality of resistors.

14. The system of claim 13, wherein the bias current generator circuitry is to generate a second bias current using the second one of the plurality of resistors.

15. A method, comprising:
reducing a supply voltage sensitivity of an output current of bias current generator circuitry by:
generating a first bias current using the bias current generator circuitry; and
generating a second bias current using the bias current generator circuitry, wherein:
a first resistor of the bias current generator circuitry is directly coupled to a source/drain region of a first transistor of the bias current generator circuitry and a source/drain region of a second transistor of the bias current generator circuitry;
a second resistor of the bias current generator circuitry is directly coupled to a source/drain region of a third transistor of the bias current generator circuitry and gates of both the second transistor and a fourth transistor of the bias current generator circuitry; and
the first transistor and the third transistor are directly coupled to ground.

16. The method of claim 15, further comprising providing the output current of the bias current generator circuitry to additional circuitry.

17. The method of claim 16, further comprising comparing, by the additional circuitry, a first output current and a second output current and outputting, by the additional circuitry, a signal to indicate whether the first output current is larger than the second output current.

* * * * *